(12) United States Patent
Shinkai et al.

(10) Patent No.: US 9,586,401 B2
(45) Date of Patent: Mar. 7, 2017

(54) PIEZOELECTRIC THIN FILM ELEMENT, INKJET RECORDING HEAD, AND INKJET IMAGE-FORMING APPARATUS

(71) Applicants: Masaru Shinkai, Yokohama (JP); Masahiro Ishimori, Inagi (JP); Toshiaki Masuda, Atsugi (JP)

(72) Inventors: Masaru Shinkai, Yokohama (JP); Masahiro Ishimori, Inagi (JP); Toshiaki Masuda, Atsugi (JP)

(73) Assignee: RICOH COMPANY, LTD., Tokyo (JP)

( * ) Notice: Subject to any disclaimer, the term of this patent is extended or adjusted under 35 U.S.C. 154(b) by 12 days.

(21) Appl. No.: 14/206,092

(22) Filed: Mar. 12, 2014

(65) Prior Publication Data

US 2014/0267509 A1    Sep. 18, 2014

(30) Foreign Application Priority Data

Mar. 14, 2013  (JP) ................................ 2013-051187
Nov. 1, 2013    (JP) ................................ 2013-228709

(51) Int. Cl.
*B41J 2/045*    (2006.01)
*B41J 2/14*      (2006.01)
(Continued)

(52) U.S. Cl.
CPC .......... *B41J 2/14233* (2013.01); *B41J 2/161* (2013.01); *B41J 2/1629* (2013.01); *B41J 2/1631* (2013.01); *B41J 2/1642* (2013.01); *B41J 2/1645* (2013.01); *B41J 2/1646* (2013.01); *H01L 41/0477* (2013.01); *H01L 41/0815* (2013.01); *H01L 41/09* (2013.01); *H01L 41/0973* (2013.01);
(Continued)

(58) Field of Classification Search
CPC ...... B41J 2/14233; B41J 2/14209; B41J 2/03; H02N 2/163; H03H 9/02559; H01L 41/047
USPC ......... 347/71, 72, 70; 310/311, 323.06, 357, 310/363; 29/25.35
See application file for complete search history.

(56) References Cited

U.S. PATENT DOCUMENTS 6,096,434 A    8/2000  Yano et al.
6,194,228 B1   2/2001  Fujiki et al.
(Continued)

FOREIGN PATENT DOCUMENTS

JP    10-287983    10/1998
JP    11-191646     7/1999
(Continued)

*Primary Examiner* — Matthew Luu
*Assistant Examiner* — Patrick King
(74) *Attorney, Agent, or Firm* — Cooper & Dunham LLP

(57) ABSTRACT

A piezoelectric thin film element includes a substrate, a vibration plate provided on the substrate, a lower electrode provided on the vibration plate, the lower electrode including at least a platinum metal film or an iridium metal film, a piezoelectric film provided on the lower electrode, the piezoelectric film including a polycrystalline body, and an upper electrode provided on the piezoelectric film, the lower electrode being provided on an upper portion of a titanium oxide film formed on the vibration plate, the lower electrode including a platinum metal film or an iridium metal film formed on the titanium oxide film and conductive oxide formed on the platinum metal film or the iridium metal film, and the platinum metal film or the iridium metal film being a precise film.

13 Claims, 7 Drawing Sheets

(51) Int. Cl.
  *H01L 41/09* (2006.01)
  *H01L 41/314* (2013.01)
  *B41J 2/16* (2006.01)
  *H01L 41/047* (2006.01)
  *H01L 41/08* (2006.01)
  *H01L 41/187* (2006.01)
  *H01L 41/317* (2013.01)

(52) U.S. Cl.
  CPC ........ *H01L 41/1876* (2013.01); *H01L 41/314* (2013.01); *H01L 41/317* (2013.01); *Y10T 29/42* (2015.01)

(56) References Cited

U.S. PATENT DOCUMENTS

| | | | |
|---|---|---|---|
| 6,351,006 | B1 | 2/2002 | Yamakawa et al. |
| 6,599,757 | B1 | 7/2003 | Murai |
| 2002/0123158 | A1 | 9/2002 | Murai |
| 2003/0071878 | A1 | 4/2003 | Murai |
| 2003/0090550 | A1 | 5/2003 | Murai |
| 2003/0092203 | A1 | 5/2003 | Murai |
| 2003/0197174 | A1* | 10/2003 | Matsuda ............... B41J 2/14233 257/43 |
| 2004/0173823 | A1 | 9/2004 | Murai |
| 2005/0206274 | A1* | 9/2005 | Kobane ................ H01L 41/273 310/328 |
| 2006/0170736 | A1* | 8/2006 | Tomozawa ........... B41J 2/14233 347/71 |
| 2008/0012910 | A1* | 1/2008 | Matsuda et al. ................. 347/68 |
| 2010/0320874 | A1* | 12/2010 | Suenaga et al. .............. 310/357 |
| 2011/0102515 | A1* | 5/2011 | Asaoka .................... B41J 2/055 347/68 |
| 2012/0305665 | A1* | 12/2012 | Ohashi ....................... 239/102.2 |
| 2013/0002767 | A1 | 1/2013 | Mizukami et al. |
| 2013/0070029 | A1 | 3/2013 | Mizukami et al. |
| 2013/0162726 | A1 | 6/2013 | Mizukami et al. |
| 2013/0250007 | A1 | 9/2013 | Ishimori et al. |
| 2013/0250009 | A1 | 9/2013 | Ishimori et al. |

FOREIGN PATENT DOCUMENTS

| | | |
|---|---|---|
| JP | 11-195768 | 7/1999 |
| JP | 11-214763 | 8/1999 |
| JP | 2001-88294 | 4/2001 |
| JP | 2001-223403 | 8/2001 |
| JP | 3249496 | 11/2001 |
| JP | 2003-218325 | 7/2003 |
| JP | 3472087 | 9/2003 |
| JP | 2004-186646 | 7/2004 |
| JP | 2004-262253 | 9/2004 |
| JP | 2006-245141 | 9/2006 |
| JP | 2007-35883 | 2/2007 |
| JP | 2007-258389 | 10/2007 |
| JP | 2009-206329 | 9/2009 |
| JP | 2010-8744 | 4/2010 |
| WO | WO2012/165110 A1 | 12/2012 |

* cited by examiner

PIEZOELECTRIC THIN FILM ELEMENT, INKJET RECORDING HEAD, AND INKJET IMAGE-FORMING APPARATUS

PRIORITY CLAIM

The present application is based on and claims priority from Japanese Patent Application No. 2013-51187, filed on Mar. 14, 2013, and Japanese Patent Application No. 2013-228709, filed on Nov. 1, 2013, the disclosures of which are hereby incorporated by reference in their entirety.

BACKGROUND

Field of the Invention

The present invention relates to a piezoelectric thin film element, an inkjet recording head having the piezoelectric thin film element, and an inkjet image-forming apparatus having the inkjet recording head.

Description of the Related Art

An image recorder or an image-forming apparatus such as a printer, facsimile machine, or copier includes an inkjet recorder provided with an inkjet recording head as a liquid discharge head (liquid drop head). Two types of inkjet recording heads (ink drop head) are in practical use, for example, an inkjet recording head using a piezoelectric actuator of a longitudinal vibration mode which extends and contracts in the axis direction of a piezoelectric film (hereinafter referred to as a piezoelectric body or piezoelectric thin film), and an inkjet recording head using a piezoelectric actuator of a flexural vibration mode.

The inkjet recording head using the piezoelectric actuator of the longitudinal vibration mode includes a piezoelectric element (piezoelectric thin film element) in which an electromechanical conversion element is laminated on a vibration plate. The electromechanical conversion element includes a piezoelectric film (piezoelectric body) of a longitudinal vibration mode which extends and contracts (expansion and contraction) in the axis direction (longitudinal direction), and an electrode which sandwiches the piezoelectric film (piezoelectric body) from top and bottom. The inkjet recording head is configured to discharge ink in a pressurizing chamber from a nozzle as drops by pressuring the ink in the pressurizing chamber with the expansion and contraction of the piezoelectric film.

In the inkjet recording film using the actuator of flexural vibration mode, it is known that an even piezoelectric film is formed as a piezoelectric material layer over the entire surface of the vibration plate with a film-forming technique, and the piezoelectric material layer is separated into a shape corresponding to a pressure generation chamber with a lithography method. The piezoelectric element is individually formed in each pressure generation room.

For example, Patent Document 1 (JP 2004-186646A) discloses that a piezoelectric film having good crystal orientation can be obtained by forming a piezoelectric film on a noble metal electrode containing titanium deposited in a strip shape on the surface.

For example, Patent Document 2 (JP 2004-262253A) discloses that a piezoelectric film having good crystal orientation can be formed by using an MgO substrate as a substrate.

For example, Patent Document 3 (JP 2003-218325A) discloses a method of manufacturing a ferroelectric film as a piezoelectric film by forming an amorphous ferroelectric film, and then crystallizing the film with a rapid heating method.

For example, Patent Document 4 (JP 2007-258389A) discloses a film-forming process using a perovskite composite oxide (may contain unavoidable impurities) having any one of a tetragonal crystal system, orthorhombic crystal system, and a rhombohedral crystal system. The perovskite composite oxide is preferentially oriented to any one of (100), (001), and (111) planes, and forms a piezoelectric film in which the orientation degree is 95% or more.

Many of the piezoelectric films in Patent Documents 1-4 are made of a PZT (lead zirconate titanium) film on platinum. Moreover, a metal material such as Pt, Ir, Ru, Ti, Ta, Rh, or Pd is used as an electrode material. In general, platinum is frequently used because it has a strong self orientation owing to a face-cemented cubic lattice (FCC) structure of a close-packing structure, strongly orients to (111) even if it forms a film on an amorphous substrate such as $SiO_2$ which is a material of a vibration plate, and the piezoelectric film formed thereon has a good orientation.

However, the piezoelectric film in Patent Documents 1-4 has a problem in that column crystals grow due to strong orientation, and for example, Pb easily diffuses in a base electrode along a grain boundary.

Moreover, there is a possibility that oxygen loss in the piezoelectric thin film increases over time in the operation of the piezoelectric thin film (piezoelectric film, piezoelectric body). A conductive oxide electrode is used as a supplemental source of the oxygen loss component.

In order to form a piezoelectric thin film, a conductive oxygen electrode formed just below the piezoelectric thin film is important. Ruthenium acid strontium $SrRuO_3$ (hereinafter, referred to as SRO) includes a perovskite crystal structure which is the same as that of PZT. Therefore, it has a good bonding performance in an interface, easily achieves epitaxial growth of PZT, and has a good property as a diffusion barrier layer of Pb (refer to, for example, Patent Document 5 (JP 3249496B), Patent Document 6 (JP 3472087B), and Patent Document 7 (JP H11-195768A)).

A crystal substrate can be used as a member for obtaining a piezoelectric body having good crystallizability as described in Patent Document 2. However, an application range is generally increased when a base film having good crystallizability is used. For this reason, it is advantageous to select a film having good crystallizability as a base layer of a piezoelectric film. The crystallizability is evaluated with X-ray diffraction measurement. The index includes uniform crystal surfaces or large crystal. A large particle diameter is preferable as an external appearance.

On the other hand, Patent Document 8 (JP 2007-35883A) proposes a precise film having a relatively small crystal particle diameter. In this case, it is necessary to maintain a flat surface of a film, so that lead can be prevented from diffusing to the lower layer side from the piezoelectric film.

Moreover, a piezoelectric body having (111) orientation and (100) orientation is used as a piezoelectric body having good crystallization in which crystal axes are aligned. There is a technique in which a layer is added to the piezoelectric body side of the lower electrode, and the main orientation is controlled, in order to provide uniform orientation. As an example of the orientation control layer, a layer using a metal layer or an oxidative metal layer is used (for example, refer to Patent Document 9 (JP 2001-88294A) and Patent Document 10 (JP 2006-245141A)). There is also a technique which forms piezoelectric films having a different composition till the orientation control layer, and then forms a main piezoelectric body along the orientation.

The crystal orientation of the piezoelectric film can be controlled when deterioration in the piezoelectric body due to Pb diffusion is prevented. The piezoelectric film on an SRO oxide electrode formed on a Pt electrode or an Ir electrode has (111) main orientation.

Patent Document 8 discloses an actuator made of a titanium oxidized film crystallized on the oxidized film on the vibration plate. The oxidized film has a thickness of 10 nm or more and 40 nm or less, and a particle diameter of 10 nm or more and 20 nm or less. However, in order to improve a property of a piezoelectric film, it is considered to increase the crystallizability (in particular, the particle diameter) of the base film.

To that end, it is necessary to change a process, for example, increasing a forming temperature. The crystal particle diameter can be increased if the temperature is increased. However, an adverse effect such as a hole in a crystal grain boundary occurs. Therefore, it has been investigated as to whether or not a large crystal particle can be obtained without the occurrence of such an adverse effect.

SUMMARY

It is therefore an object of the present invention to provide a piezoelectric thin film element which can improve a property of a piezoelectric film by controlling composition diffusion to a base layer which deteriorates in a property of a dielectric thin film, an inkjet recording head including the piezoelectric thin film, and an inkjet image-forming apparatus.

In order to achieve the above object, one embodiment of the present invention provides a piezoelectric thin film element, including: a substrate; a vibration plate provided on the substrate; a lower electrode provided on the vibration plate, the lower electrode including at least a platinum metal film or an iridium metal film; a piezoelectric film provided on the lower electrode, the piezoelectric film including a polycrystalline body; and an upper electrode provided on the piezoelectric film, the lower electrode being provided on an upper portion of a titanium oxide film formed on the vibration plate, the lower electrode including a platinum metal film or an iridium metal film formed on the titanium oxide film and conductive oxide formed on the platinum metal film or the iridium metal film, and the platinum metal film or the iridium metal film being a precise film having a thickness of 150 nm or more and 250 nm or less and an average particle diameter of crystal of 250 nm or more without having a hole.

BRIEF DESCRIPTION OF THE DRAWINGS

The accompanying drawings are included to provide further understanding of the invention, and are incorporated in and constitute a part of this specification. The drawings illustrate embodiments of the invention and, together with the specification, serve to explain the principle of the invention.

DETAILED DESCRIPTION OF THE PREFERRED EMBODIMENTS

Figure 1:
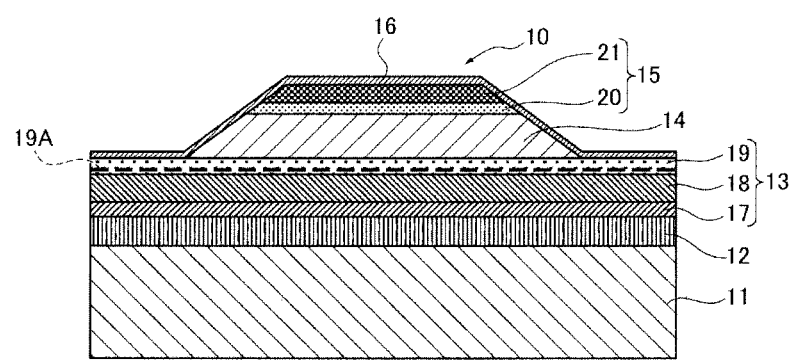
FIG. 1 is a sectional view illustrating a configuration of a piezoelectric thin film element according to Embodiment 1.

Hereinafter, embodiments of the present invention will be described with reference to the drawings.

Embodiments

Embodiment 1

In the present embodiment, a piezoelectric thin film element includes a substrate, a vibration plate provided on the substrate, a lower electrode which is provided on the vibration plate, and includes at least a platinum metal film or an iridium metal film, a piezoelectric film which is provided on the lower electrode, and includes a polycrystalline body, and an upper electrode provided on the piezoelectric film. The lower electrode is provided on an upper portion of a titanium oxide film formed on the vibration plate. The lower electrode includes a platinum metal film or an iridium metal film formed on the titanium oxide film, and a conductive oxide formed on the platinum metal film or the iridium metal film. The platinum metal film or the iridium metal film is a precise film having a thickness of 150 nm or more and 250 nm or less and a crystal average particle diameter of 250 nm or more without having a hole.

In addition, when the deterioration in the piezoelectric body due to Pb diffusion is prevented, the crystal orientation of the piezoelectric film can be controlled. The piezoelectric film on an SRO oxide electrode formed on a Pt electrode or an Ir electrode becomes (111) main orientation. The piezoelectric film having (100) main orientation can be obtained by using a thin titanium oxide film instead of an oxide electrode film. In this case, the deterioration in the piezoelectric body having (111) main orientation can be prevented, and the piezoelectric film having (100) main orientation has good crystallizability, so that the deterioration in the piezoelectric body can also be effectively prevented.

At first, the reason why the piezoelectric film having (100) main orientation is obtained by forming a thin titanium oxide film will be described. In general, the orientation of the piezoelectric body base layer and the piezoelectric film is dominated by the matching of lattice intervals of the atoms. Namely, the axis in which the lattice intervals of the base layer and the lattice intervals of the piezoelectric body laminated on the base layer are close dominantly grows. For example, SRO grows with the lattice intervals close to the lattice intervals of Pt (111), and the piezoelectric film close to the lattice intervals of SRO grows thereon. In this case, the piezoelectric film includes (111) main orientation, and (100) is not formed.

The crystallizability of the titanium oxide, which is formed instead of an SRO film, is 2θ=39.88 from the result of X-ray diffraction, and is close to 2θ=39.3 of the (111) orientation peak of the piezoelectric body PZT. It has a good lattice interval matching and becomes (111) main orientation.

However, a reaction with a Pb component in SG liquid occurs on the titanium de surface, and $PbTiO_3$ is formed. This $PbTiO_3$ has (100) orientation, so that the piezoelectric body PZT laminated thereon has (100) orientation, not (111) orientation.

However, in a situation in which the Pb component diffuses on the lower electrode side, the reaction of the Pb component and the titanium oxide is developed under a Pb component-deficient condition. Thus, a piezoelectric film having good (100) orientation cannot be obtained. If a precise lower electrode film without having a hole according to the present embodiment is used, the reaction of the Pb component in the SG liquid and the titanium oxide formed on the lower electrode occurs without the occurrence of Pb diffusion, so that a piezoelectric film having (100) main orientation can be formed.

FIG. 1 is a sectional view illustrating the configuration of a piezoelectric thin film element 10 according to the present embodiment. The piezoelectric thin film element 10 includes a substrate 11, a film formation vibration plate 12 on the substrate 11, a lower electrode 13 on the film formation vibration plate 12, a piezoelectric film (electromechanical conversion film) 14 including a polycrystalline body on the lower electrode 13, an upper electrode 15 on the piezoelectric film 14, and a protective film 16 on the upper electrode 15. In addition, the protective film 16 is a passivation film.

The film formation vibration plate 12 can be a vibration plate including a single material, or can include a not-shown plurality of laminated films. The lower electrode 13 includes an electrode adhesion layer 17, a lower electrode layer 18 formed on the electrode adhesion layer 17, and a conductive oxide layer 19 formed on the lower electrode layer 18. The upper electrode 15 includes a conductive oxide layer 20 and an upper electrode layer 21 formed on the conductive oxide layer 20.

In this case, in the present embodiment, the electrode adhesion layer 17, lower electrode layer 18, and conductive oxide layer 19 have a feature which improves the property of the piezoelectric film 14 by improving a particle diameter. The above-described conventional examples illustrate that SRO has an effect of preventing Pb diffusion. However, if a Pt film (lower electrode layer 18) has a defect such as a hole, not only the Pt film but also the conductive oxide film 19 cannot be prevented from being diffused by Pb. Namely, it was recognized that the Pb diffusion prevention effect is not sufficient due to a base film even if SRO is laminated. On the other hand, it is important to prevent the Pb diffusion in order to obtain a preferable piezoelectric film 14. If the Pb diffusion occurs, it is expected that it becomes difficult to equalize the Pb concentration in the piezoelectric film 14, and also the crystallizability is at least deteriorated by the composition variation. As a result, the electric property of the piezoelectric film 14 and the displacement property when using as the electromechanical convertor are affected.

It is preferable to use a silicon single crystal substrate as the substrate 11. It is generally preferable to have thickness of 100 to 600 μm. The plane orientation includes three types such as (100), (110), and (111). In general, (100) and (111) are widely used in the semiconductor industry. In the present embodiment, a single crystal substrate having (100) plane orientation is mainly used.

Figure 2:
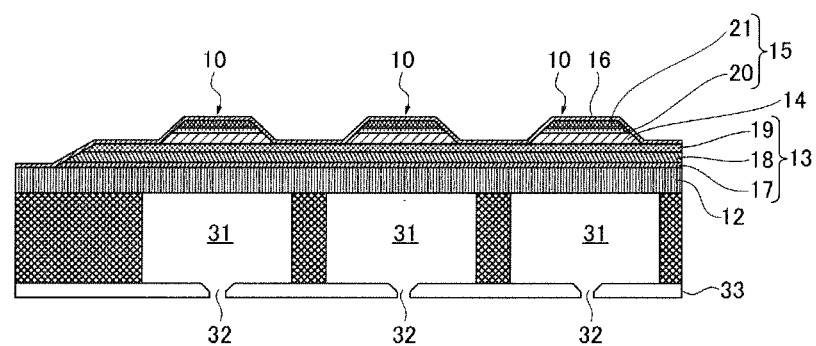
FIG. 2 is a sectional view illustrating a part of an inkjet recording head including the piezoelectric thin film element in FIG. 1.

FIG. 2 is a sectional view illustrating a part of an inkjet recording head including the piezoelectric thin film element 10 in FIG. 1. Referring to FIG. 2, three piezoelectric thin film elements 10 are arranged in the lateral direction (actual inkjet recording head generally includes four or more piezoelectric thin film elements). A cavity (pressure chamber) 31 is formed below each piezoelectric thin film element 10. Each cavity 31 is blocked by a nozzle plate 33 provided with a nozzle hole 32.

When manufacturing such a cavity 31, a silicon single crystal substrate is processed by etching. It is general to use anisotropic etching as the etching method. The anisotropic etching uses a property in which an etching speed differs relative to a plane orientation of a crystal structure. For example, in the anisotropic etching dipped in alkali solution such as KOH, (111) plane has an etching speed of about 1/400 compared with (100) plane.

Accordingly, a structure having an inclination of about 54.74 degree is manufactured in (100) plane orientation, whereas a deep groove can be formed in (110) plane orientation. Therefore, the arrangement density can be improved while maintaining a stiffness property. In the present embodiment, a single crystal substrate having (110) plane orientation can be used. In this case, it is necessary to pay attention that $SiO_2$ as a masking material is also etched.

In the inkjet recording head illustrated in FIG. 2, the film formation vibration plate 12 deforms by the power generated in the piezoelectric film (electromechanical convertor 14, and the ink in the cavity 31 is discharged as ink drops from the nozzle hole 32. For this reason, it is preferable for the film formation vibration plate 12 to have a predetermined strength. The film formation vibration plate 12 can be made of a single material, or can be made of a not-shown plurality of laminated films.

The method of forming the film formation vibration plate 12 includes a sputtering method, a combination of a sputtering method and a thermal oxidation method, an MOCV (Metal Organic Chemical Vapor Deposition), or the like. In this embodiment, when laminating a plurality of films, the film formation vibration plate 12 is manufactured by an LPCVD method. The surface roughness of the film formation vibration plate 12 has an arithmetic average roughness of 4 nm or less. If the surface roughness exceeds this range, the insulation resistance property of the formed PZT is deteriorated, so that leakage easily occurs. The material includes polysilicon, a silicon dioxide film, a silicon nitride film, or the combination of these. The film formation vibration plate 12 manufactured by an LPCVD method is a film generally applied in a semiconductor or a MEMS device. Since such a film formation vibration plate 12 is easily manufactured, a stable vibration plate can be obtained without having a new process issue and using an expensive substrate such as a SOI (Silicon-on-Insulator).

The configuration example in the film formation vibration plate 12 will be described. A silicon dioxide film (for example, 200 nm in thickness) is formed by an LPCVD method (or thermal process film-forming method) on the silicon single crystal substrate having (100) plane orientation as a vibration plate configuration film, and then a polysilicon film (for example, 500 nm in thickness) is formed. It is preferable for the thickness of the polysilicon film to be 0.1 to 3 μm, and for the surface roughness to be 5 nm or less in arithmetic average roughness. Next, the silicon nitride film is formed by an LPCVD method as the vibration plate configuration film.

A material containing an element having (111) orientation formed directly on the substrate or formed on the substrate through an intermediate layer is used as the lower electrode 13. The lower electrode 13 includes metal or metal oxide having at least several types selected from Pt, Ir, $IrO_2$, $RuO_2$, $LaNiO_3$, and $SrRuO_3$ as a main component, and the combination of these. Platinum having a high heat resistance property and a low reactive property is used as a metal material. However, it may not have a sufficient harrier performance relative to lead. The metal material includes platinoid elements such as iridium or platinum-rhodium, or an alloy film of these. It is preferable to laminate Ti, $TiO_2$, Ta, $Ta_2O_5$, $Ta_3N_5$ or the like in advance because platinum does not have preferable adhesion to the film formation vibration plate.

A sputtering method or vacuum film formation method such as vacuum deposition is general as a method of manufacturing the lower electrode 13. It is preferable for the film thickness of the entire electrode layer to be 0.05 to 1 μm, and more preferably to be 0.1 to 0.5 μm. It is preferable to have (111) orientation or (100) orientation as crystallizability when selecting PTZ as an electromechanical conversion film. It is preferable to include Pt having high (111) orientation as a material for the lower electrode, in order to obtain PZT (111) orientation. As the conductive oxide layer (orientation control layer) 19 in FIG. 1, a material having preferable lattice interval matching with PZT (111), for example, SRO can be used.

When obtaining PZT (100) orientation, Pt having high Pt (111) orientation is desirable. However, when obtaining PZT (100), the orientation control layer 19A (refer to FIG. 1) which crystal-grows PZT (100) is required on Pt. An extremely thin film of titanium oxide is preferable as the orientation control layer 19A. It is known why the titanium oxide is preferable, but it is considered that the asperities on the surface of the film affect the crystallizability of PZT, not crystal lattice matching. It is also considered that a new orientation control layer is formed based on reaction of titanium oxide and SG (sol-gel) liquid laminated thereon. For example, in the latter method, the titanium oxide film reacts with Pb or PbO in SG liquid, so that $PbTiO_3$ is obtained. $PbTiO_3$ has (100) orientation, and the PZT component to be sequentially laminated has (100) orientation. However, these processes have not been sufficiently clarified because these processes are difficult to measure with X-ray diffraction due to thin thickness. However, in an experiment, the peak of PZT (00) is obtained upon the formation of the titanium oxide with a thin film thickness on Pt.

As described above, PZT (111) and PZT (100) can be obtained by changing the crystallizability control layer on Pt (111). A preferable less deteriorated piezoelectric body can be achieved if Pt is a film without having a hole and without the loss of an SG liquid component, in particular, a Pb component.

The upper electrode 15 is not specifically limited, and includes the material exampled for the lower electrode 13, a material generally used in a semiconductor process such as Al, Cu, or the combination of these.

PZT is mainly used as the piezoelectric film (electromechanical convertor film) 14. PZT is a solid solution of lead zirconate ($PbZrO_3$) and lead titanate ($PbTiO_3$), and has differing properties according to the ratio. A composition showing a good piezoelectric property is one having a ratio of $PbZrO_3$ and $PbTiO_3$ is a ratio of 53:47. It is shown by the chemical formula such as Pb $(Zr_{0.53}Ti_{0.47})O_3$, in general, PZT (53/47). The complex oxide in addition to PZT includes barium titanate. In this case, a bariumalkoxide, or titaniumalkoxide compound is used as a start material, and these are solved in the common solvent, so that a titanium acid barium precursor solution can be manufactured.

These materials are defined with a general expression $ABO_3$, and include the complex oxide having A=Pb, Ba, Sr and B=Ti, Zr, Sn, Ni, Zn, Mg, Nb as a main component. The specific definition is $(Pb_{1-x}, Ba)(Zr, Ti)O_3$, $(Pb_{1-x}, Sr)(Zr, Ti)O_3$. This is a case in which a part of Pb of A is substituted by Ba or Sr. Such substitution can be made by a dyad, and the effect shows a function which reduces deterioration in a property due to the evaporation of lead during a heating process.

The piezoelectric film 14 can be manufactured by a spin coater with a sputtering method or a Sol-gel method. In this case, a desired pattern is obtained by photolithoetching or the like because patterning is required.

When manufacturing PZT with a Sol-gel method, a lead acetate, zirconium alkoxide, or titanium alkoxide compound is used as a start material, and dissolves in methoxyethanol as a common solvent, so as to obtain a homogenous solution. Therefore, a PZT precursor solvent can be manufactured. The metal alkoxide component is easily hydrolyzed by moisture in the atmosphere. Thus, stabilizing agent such as acetylacetone, acetic acid, or diethanolamine can be appropriately added to the precursor solvent.

When providing the PZT film over the enter surface of the base substrate, a coating film is formed with a solution-applying method such as spin coating, and respective heat treatments of solvent drying, heat decomposition, and crystallization are applied, so that the PZT film is obtained. A change in the crystallized film from the coating film is associated with volume contraction. Therefore, it is necessary to adjust the precursor concentration so as to obtain film thickness of 100 nm or less by one process for obtaining a crack free film.

When manufacturing with an inkjet method, a film patterned by the same manufacturing flow as the second electrode can be obtained. The surface-reforming material differs according to a material of a base (first electrode). When an oxidative product is used as a base, a silane component is mainly selected, and when metal is used a base, alkanethiol is mainly selected.

It is preferable for the thickness of the piezoelectric film (electromechanical conversion film) 14 to be 0.5 to 5 μm, more preferably to be 1 to 2 μm. If the thickness is smaller than this range, sufficient displacement cannot be generated. If the thickness is larger than this range, many layers are laminated, so that the number of processes is increased, and the process time is also increased.

PZT is evaluated by an X-ray diffractometer after forming the film into 2 μm by spin coating with a solvent manufactured by a Sol-gel method. Thereby, PZT can obtain a film in which (111) plane is preferentially oriented. An oriented film in addition to (111) can be obtained according to a heat treatment condition of PZT. It is preferable for the orientation degree of the main peak to be 0.8 to 0.95 and (110) orientation to be 0.10 or below when using the following formula.

The following formula (1) is a calculation method which represents a ratio of orientation when the sum of the peak of each orientation of (111), (100), (110) obtained with XRD (X-ray Diffraction) is 1, and represents ρ of an average orientation degree (orientation ratio).

$$\rho = I(hkl)/\Sigma I(hkl) \quad (1)$$

In this case, regarding the above formula (1), the denominator represents the sum of each peak intensity of (111), (100), (110), and the numerator represents a peak intensity of arbitrary orientation. If the orientation degree exceeds the above range, a sufficient property cannot be obtained for deterioration in displacement after continuous driving.

Figure 3:
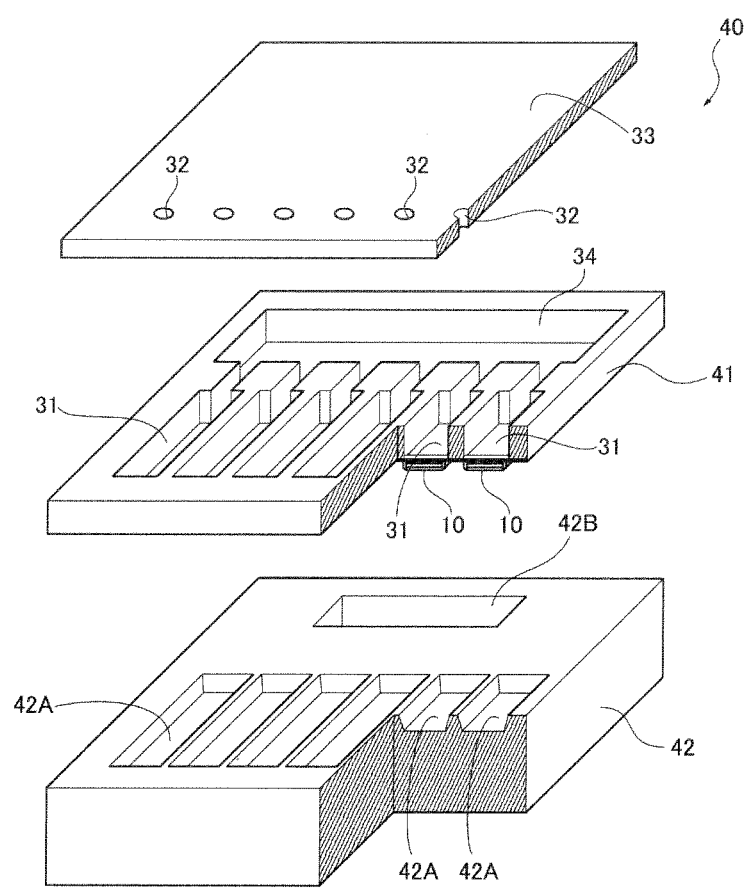
FIG. 3 is an exploded perspective view of the inkjet recording head.

FIG. 3 illustrates an exploded perspective view of an inkjet recording head 40. The inkjet recording head 40 includes a recording head main body 41 (refer to FIG. 2) having a plurality of piezoelectric thin film elements 10 illustrated in FIG. 1 and a plurality of cavities 31. The recording head main body 41 is provided with a cavity assembly 34 communicating with each of the cavities 31.

A cover 42 including a concave portion 42A in which the piezoelectric thin film element 10 is provided is provided below the recording head main body 41. An ink supply port 42B is provided in the cover 42. When attaching the cover 42 to the recording head main body 41, the ink supply port 42B is connected to the cavity assembly 34 of the recording head main body 41.

A nozzle plate 33 having a plurality of nozzle holes 32 is provided above the recording head main body 41, and each of the nozzle holes 32 is disposed in a position corresponding to each of the cavities 31 upon the attachment of the nozzle plate 33 to the recording head main body 41.

The following Experimental Examples 1-11 were performed for the present embodiment, and the results of Experimental Examples were compared with Comparative Examples 1-3.

Experimental Example 1

Figure 5:
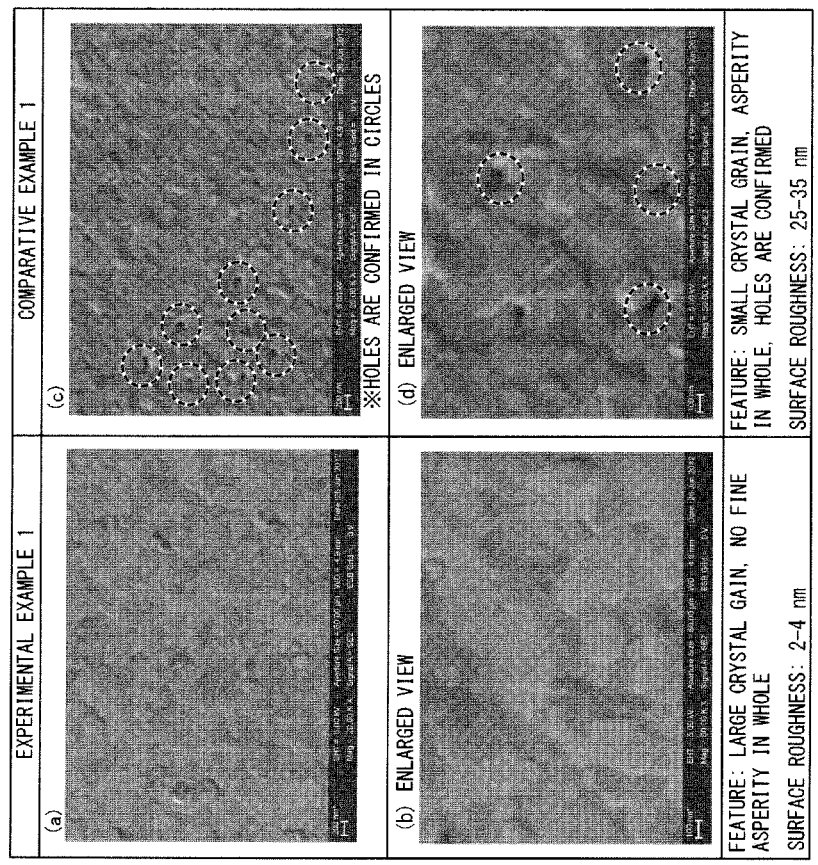
FIG. 5 is a view illustrating a Pt portion photographed by SEM. (a) provides a view according to Embodiment 1; (b) provides an enlarged view of (a); (c) provides a view according to Comparative Example 1; and (d) provides an enlarged view of (c).

A precise platinum metal film having a thickness of 150 nm or more and 250 nm or less and an average particle diameter of 250 nm or more without having holes or the like was formed. In FIG. 5, (a) illustrates a photograph of the platinum metal film by SEM, and (b) illustrates an enlarged view of (a).

After forming a thermally-oxidized film on the surface of a Si substrate 11, a laminated film on vibration plate 12 was formed by CVD. In particular, the thermally-oxidized film (600 nm in thickness) was formed on a silicon wafer, and then the plate was formed on the thermally-oxidized film with a PCVD method. A polysilicon film of 200 nm was formed. After that, the silicon dioxide film was formed into 100 nm in thickness, and a silicon nitride film was formed into 150 nm in thickness with an LPCVD method. Then, the silicon dioxide film was formed into 150 nm, the silicon nitride film was formed into 150 nm, the silicon dioxide film was formed into 100 nm, and the polysilicon film was formed into 200 nm. Finally, the silicon dioxide film was formed into 600 nm in thickness, and the film formation vibration plate 12 was obtained through the entire laminated films. In addition, in FIGS. 1, 2, the film formation vibration plate 12 includes one layer.

Next, the electrode adhesion layer 17 of the lower electrode 13 was formed on the CVD laminated film as the film formation vibration plate 12 by adhering the layer 17 to the CVD laminated film. As a method of forming the electrode adhesion layer 17, after forming a Ti metal film with a sputtering method, the metal film was oxidatively-treated in an oxygen atmosphere with a RTA (Rapid Thermal Anneal) device, and the metal film was formed as a TiO$_2$ film. The Ti metal film formation device is an automatic sputtering machine E-401S made by Canon Anelva Corporation.

The conditions for forming the electrode adhesion layer 17 were a substrate temperature of 150° C., RF input power of 500 W, Ar gas pressure of 1.3 Pa, and the formed film thickness of 50 nm. Thermal oxidation burning was performed on the Ti metal film for three minutes at 730° C. (rate of temperature increase 30° C./sec) and an oxygen flow rate of 1 sccm in an atmosphere of oxygen of 100%. The film thickness after the burning was 83 to 86 nm.

Next, a Pt electrode as the lower electrode layer 18 was formed into 160 nm in film thickness. The process conditions were a substrate temperature of 300° C., RF input power of 500 W, and Ar gas pressure of 1.3 Pa. (111) plane of the lower electrode layer 18 was thereby oriented in the film thickness direction.

The surface condition of the Pt electrode observed by SEM with this state is shown in FIG. 5 (refer to (a) and (b)). After measuring the particle diameter of the crystal, the average diameter was 272 nm. The particle diameter was measured with a size of 25 points of the crystal particle in the main scanning direction of the electron beam of the scanning electron microscope, and the average value was obtained. The scanning electron microscope showed a flat image with a clear particle boundary without having asperities. The surface roughness of the sample was Sa 2 to 4 nm.

Next, an SrRuO$_3$ film having 60 nm in thickness was formed on the lower electrode layer 18 as the conductive oxide layer 19. The formation conditions were a substrate temperature of 550° C., RF input power of 500 W, and gas pressure of 6 Pa with Ar gas containing 30% of O$_2$ gas as sputtering gas.

Next, the piezoelectric film 14 was formed. The most common raw material of PZT (composition for Zr/Ti=52/48 after burning, 15 atomic % of Pb excess quantity) was selected as the piezoelectric material. The piezoelectric film 14 was formed with alkoxide having Pb, Zr, Ti as metal elements constituting PZT as a start material. After the spin coating of one layer, the piezoelectric film was burned in an oxygen atmosphere with a RTA device under a condition of 490° C.×5 min. Next, the second and third layers were similarly solidified and burned, and burned in a dry air atmosphere under a condition of 750° C.×3 min as the burning for crystallization. The film thickness of the laminated three layers (M=3) was 250 nm. The lamination of the three layers was repeated by the same procedures, and the piezoelectric film 14 having 2 μm in a total thickness was formed.

Next, after laminating the piezoelectric body of 2.0 μm, the upper electrode 15 was formed, so as to obtain a device. The device was evaluated. At first, SrRuO$_3$ having 40 nm in thickness was formed on the piezoelectric body 14 as the conductive oxide layer 20. The formation conditions were a substrate temperature of 550° C., RF input power of 300 W, and gas pressure of 6 Pa with Ar gas containing 30% of O$_2$ gas as sputtered gas. The Pt electrode which becomes the upper electrode layer 21 was formed into 125 nm in thickness. The process conditions were a substrate temperature of 300° C., RF input power of 500 W, and Ar gas pressure of 1.3 Pa.

After that, the resist pattern was formed by using a photolithography technique. Then, etching and resist ashing of the lamination structure were conducted so as to obtain a shape illustrated in FIG. 1 in section. The upper electrode 15 in FIG. 1 has a strip shape of 45 μm×1 mm.

After forming the passivation film 16 which protects the element, a not-shown interlayer insulation layer, the connection with the element of the wiring electrode, and a passivation film which protects the wiring to the device, the device which was formed as described above was obtained as the piezoelectric thin film element 10.

After that, the leakage current between the upper and lower electrodes was measured after a polarization treatment. In this case, the upper electrode 15 side was set to a positive electric potential and the lower electrode 13 side was set to a negative electric potential (ground electric potential).

As a polarization treatment condition, the applied voltage was set to 40V. In this case, the voltage was slowly increased from 0 V in 3 minutes, was maintained for 1 minute, and was slowly lowered to 0 V in 3 minutes.

The leakage current of the element was set such that the leakage current of the element when applying 30 V in the evaluation after the polarization became 1.8 to $2.7 \times 10^{-7}$ $A/cm^{-2}$. This leak current is small enough for the element.

The reason why the platinum metal film was set to 250 nm or below is that white turbidity of the film was observed at a thickness of more than 250 nm at a temperature of 550° C. or more as a Pt formation temperature condition. It is considered that the surface roughness is increased (about Sa 15 to 20 nm).

For this reason, the upper limit was set to 250 nm. The white turbidity was not generated in the platinum metal layer having a thickness of 150 nm or more and 250 nm or less even at 550° C. The white turbidity was not generated even at 300° C., which is the condition of the present embodiment.

The reason why the average particle diameter of the platinum metal film was set to 250 nm or more is that the particle diameter of PZT to be laminated is increased in accordance with an increase in the particle diameter, so that a preferable PZT property can be obtained.

Experimental Example 2

A cross-sectional surface was formed in the sample manufactured in Experimental Example 1, and the composition of the cross-section surface was observed. As a result, the Pb diffusion of PZT was not detected as a result of the mapping measurement relative to the lower electrode direction.

Experimental Example 3

Figure 4:
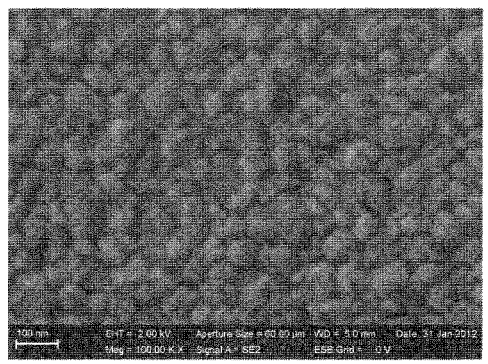
FIG. 4 is a view illustrating a $TiO_2$ portion photographed by SEM (scanning electron microscope).

$TiO_2$ film formation was completed relative to the sample in Experimental Example 1, and the particle diameter of the sample was measured. Although it differs from the configuration of the base vibration plate, the measurement result was compared with a known example as reference. The measurement result is shown in the following Table 1. The average particle diameter of $TiO_2$ which becomes the base of Pt was 77.5 nm. FIG. 4 illustrates a photograph by an electron scanning microscope.

The reason why a large particle diameter of Pt is obtained is that $TiO_2$ becomes the seed layer of the Pt crystallization.

TABLE 1

|  | KNOWN EXAMPLE PARTICLE DIAMETER OF $TiO_2$ | EXPERIMENTAL EXAMPLE 1 PARTICLE DIAMETER OF $TiO_2$ |
|---|---|---|
| VIBRATION PLATE | $ZrO_2$ | CVD LAMINATED FILM |
| THICKNESS OF Ti (BEFORE OXIDATION) | 5-20 | 50 |
| THICKNESS | 10-40 | 86 |
| PARTICLE DIAMETER | 10-20 | 57-135 |
| AVERAGE PARTICLE DIAMETER (nm) | (15) | 77.5 |

Experimental Example 4

The inkjet recording head 40 illustrated in FIG. 3 was manufactured with the manufactured piezoelectric thin film element 10, and the discharge of the ink was evaluated. The discharge condition when applying the voltage of −10 to −30 V with the simple Push waveform by using ink whose viscosity was adjusted to 5 cp was confirmed. As a result, the discharge was confirmed from almost all nozzle holes 32.

Experimental Examples 5 TO 7

Similar to Experimental Example 1, the existence and non-existence of a hole were confirmed provided that the film thickness of Pt was set to 160 nm (Experimental Example 5), to 170 nm (Experimental Example 6), and to 180 nm (Experiment Example 7). The results are illustrated in the following Table 2.

The leakage current was measured for the samples in Experimental Examples 5 to 7. As the leakage current of the element, the leakage current of the element when applying 30 V in the evaluation after the polarization was about $10^{-7}$ $A/cm^{-2}$. This leakage current is small enough for the element.

TABLE 2

|  | Pt THICKNESS | HOLE EXISTENCE/ NON-EXISTENCE | AVERAGE PARTICLE DIAMETER (nm) |
|---|---|---|---|
| COMPARATIVE EXAMPLE 3 | 130 | EXISTENCE | 205 |
| COMPARATIVE EXAMPLE 1 | 140 | EXISTENCE | 225 |
| EXPERIMENTAL EXAMPLE 1 | 150 | NON-EXISTENCE | 250 |
| EXPERIMENTAL EXAMPLE 5 | 160 | NON-EXISTENCE | 270 |
| EXPERIMENTAL EXAMPLE 6 | 170 | NON-EXISTENCE | 310 |
| EXPERIMENTAL EXAMPLE 7 | 180 | NON-EXISTENCE | 315 |

The crystallizability of Pt of the above samples and the crystallizability of PZT after forming SRO were as illustrated in the following Table 3. With the Pt film having holes, the crystallizability of Pt is low, and the crystallizability of PZT (111) on SRO as the seed layer of PZT (111) is low. However, the orientation ratio of PZT (111) is 90% or more, so that it is determined that the PZT orientation control effect of the SRO film is maintained.

TABLE 3

| | Pt THICKNESS | Pt XRD PEAK INTENSITY (kcps) | RC_FWHM | PZT(111) PEAK INTENSITY (kcps) | ORIENTATION RATIO (%) |
|---|---|---|---|---|---|
| COMPARATIVE EXAMPLE 3 | 130 | 89.5 | 4.3 | 33 | 92.5 |
| COMPARATIVE EXAMPLE 1 | 140 | 95.5 | 3.6 | 34 | 99.6 |
| EXPERIMENTAL EXAMPLE 1 | 150 | 368 | 2.6 | 57 | 99.9 |
| EXPERIMENTAL EXAMPLE 5 | 160 | 450 | 2.0 | 59 | 99.8 |
| EXPERIMENTAL EXAMPLE 6 | 170 | 510 | 2.2 | 61 | 99.8 |
| EXPERIMENTAL EXAMPLE 7 | 180 | 551 | 2.3 | 62 | 99.7 |

Experimental Example 8

Experimental Example 8 is almost the same as Experimental Example 1, but a part of Experimental Example 1 is changed for PZT (100). In this Experiment, similar to Experimental Example 1, a precise platinum metal film having a thickness of 150 nm or more and 250 nm or less and an average particle diameter of 250 nm or more without having holes was formed.

At first, after forming a thermally-oxidized film on the surface of the Si substrate 11, the laminated film formation vibration plate 12 was formed by CVD. In particular, the thermally-oxidized film was formed on the silicon wafer (600 nm in film thickness), and the film was manufactured thereon with an LPCVD method. The polysilicon film of 200 nm was formed. After that, the silicon oxidized film was formed into 100 nm in thickness, and then the silicon nitride film as formed into 150 nm with an LPCVD method. Then, the silicon oxidized film was formed into 150 nm, the silicon nitride film was formed into 150 nm, the silicon oxidized film was formed into 100 nm, the polysilicon film as formed into 200 nm, and finally, the silicon oxidized film was again formed into 600 nm, so that the film formation vibration plate 12 was obtained through the laminated entire films. In addition, the film formation vibration plate 12 is one layer in FIGS. 1, 2.

Next, the electrode adhesion layer 17 of the lower electrode 13 was formed on the CVD laminated film as the film formation vibration plate 12 by adhering the layer 17 to the CVD laminated film. As a method of forming the electrode adhesion layer 17, after forming a Ti metal film with a sputtering method, the metal film was oxidatively-treated in an oxygen atmosphere with RTA (Rapid Thermal Anneal) device, and the metal film was formed as a $TiO_2$ film. The Ti metal film formation device is an automatic sputtering machine E-401S made by Canon Anelva Corporation.

The conditions for forming the electrode adhesion layer 17 were a substrate temperature of 150° C., RF input power of 500 W, Ar gas pressure of 1.3 Pa, and a formed film thickness of 50 nm. The Ti metal film was thermally oxidized and burned for 3 minutes at 730° C. (increase of temperature rate of 30° C./sec), and an oxygen flow rate of 1 sccm in an atmosphere of oxygen of 100%. The film thickness after burning was 83 to 86 nm.

Next, a Pt electrode as the lower electrode layer 18 was formed into 160 nm in thickness. The process conditions were a substrate temperature of 300° C., RF input power of 500 W, and Ar gas pressure of 1.3 Pa. (111) plane of the lower electrode layer 18 is thereby oriented in the film thickness direction.

After observing the surface condition of the Pt electrode by SEM (scanning electron microscope), the condition of the Pt film was the same as that in FIG. 5 (refer to (a), (b)). Namely, the average particle diameter was 272 nm. The particle diameter was measured with a size of 25 points of the crystal particle in the main scanning direction of the electron beam of the scanning electron microscope, and the average value was obtained. The scanning electron microscope showed a flat image with a clear particle boundary without having asperities. The surface roughness of the sample was Sa 2 to 4 nm.

Next, as the orientation control layer 19A (refer to FIG. 1) on the lower electrode layer 18, the oxidized titanium film was formed to have film thickness of 8.6 nm on average in a wafer. At first, the Ti film was formed into about 5 nm. After that, the Ti film was thermally oxidized with a RTA (Rapid Thermal Anneal) device in an oxygen atmosphere. Ti sputter formation conditions were a substrate temperature of 150° C., RF input power of 500 W, and a gas pressure of 0.5 Pa with Ar gas as sputtering gas. After that, it was thermally oxidized and burned with a RTA device at 730° C. (increase of temperature rate of 30° C./sec), in a process time of 1 to 3 min, an oxygen flow volume of 1 to 5 litter/min, and atmosphere of oxygen 100%. The film thickness after burning was 8.0 to 8.6 nm.

In this case, the thicknesses of the Ti film and oxidized titanium film were obtained from the results of X-ray scattering light analysis by small angle irradiation with an X-ray diffractometer (X-ray diffractometer D8 Discover made by Bruker AXS Corporation).

Next, the piezoelectric film 14 was formed. As the piezoelectric material, the most common raw material of PZT (composition which becomes Zr/Ti=52/48 after burning, Pb excess quantity of 15 atomic %) was selected. The piezoelectric film was formed with alkoxide having metallic elements PB, Zr, Ti constituting PZT as a start material. The piezoelectric film after one layer spin coating was solidified and burned with a RTA device in an oxygen atmosphere under a condition of 490° C.×5 min. Next, the second and third layers were similarly solidified and burned, and they were burned in dry air under a condition of 750° C.×3 min as the burning for crystallization. The thickness of the laminated three layers (M=3) was 250 nm. The lamination of three layers was repeated by the same procedure, and the piezoelectric layer 14 having the total thickness of 2 μm was formed.

θ-2θ measurement was performed on the formed piezoelectric film with the X-ray diffractometer. It had (100) main orientation, and the ratio was (100) 0.93, (111) 0.05, and (110) 0.02.

After laminating the piezoelectric film 14 with 2.0 μm in thickness, the upper electrode 15 was formed so as to obtain a device, and the device was evaluated. At first, $SrRuO_3$ was formed on the piezoelectric body 14 with thickness of 40 nm as the conductive oxidized layer 20. The formation conditions were a substrate temperature of 550° C., RF input power of 300 W, and gas pressure of 6 Pa with Ar gas containing 30% of $O_2$ gas as sputtering gas. Moreover, the Pt electrode which becomes the upper electrode layer 21 was formed into 125 nm in thickness. The process conditions were a substrate temperature of 300° C., RF input power of 500 W of, and Ar gas pressure of 1.3 Pa.

After forming a resist pattern with a photolithography technology, the etching and resist ashing of the laminated structure were preformed to have the shape in FIG. 1 as a cross-sectional view. The upper electrode 15 had a strip shape of 45 μm×1 mm.

After forming the passivation film 16 which protects an element, a not-shown interlayer insulation layer, the connection with the element of the electrode, and the passivation film which protects the wiring, the device which was formed as described above was obtained as the piezoelectric thin film element 10.

After that, the leakage current between the upper and lower electrodes was measured after the polarization treatment. In this case, the upper electrode 15 side was set to a positive electric potential, and the lower electrode 13 side was set to a negative electric potential (ground electric potential).

The polarization treatment condition was an applied voltage of 40 V. In this case, the voltage was slowly increased from 0 V in 3 minutes, was maintained for 1 minute, and slowly lowered to 0 V in 3 minutes.

The leakage current of the element when applying 30 V in the evaluation after the polarization was $2.0 \times 10^{-7}$ A/cm$^{-2}$, and it was the same as Experimental Example 1. This leakage current is small enough for the element.

The reason why the platinum metal film was set to 250 nm or less in this Experiment Example is that white turbidity of the film was observed in the thickness more than 250 nm when the Pt formation temperature condition was a temperature of 550° C. or more. It is also considered that the surface roughness is increased (about Sa 15 to 20 nm).

For this reason, the upper limit was set to 250 nm. The white turbidity was not generated even at 550° C. when the platinum metal film was 150 nm or more and 250 nm or less. The white turbidity was not generated even under a condition of 300° C. in this Experimental Example.

The reason why the average particle diameter of the platinum metal film was set to 250 nm or more is that the particle diameter of PZT to be laminated thereon is increased in accordance with an increase in the particle diameter, and a preferable PZT property can thus be obtained.

Next, a driving durable test which reproduces actual use was performed by Hz in the application of 30 V. The stability of the driving repetition of the sample was $5 \times 10^9$ times with 5% decrease as a standard, and sufficient ues for actual use were obtained.

The evaluation condition will be described. The element was formed as the inkjet recording head, and an ink discharge repetition driving test after filling ink was performed under the following conditions. The driving time and waiting time were provided, and the driving cycle of a driving time of 370 msec and driving standby of 100 msec was set. The voltage in driving was set to 30 V, and the driving time in which the driving voltage was applied was set to 800 μsec on the total pulse by applying with 18 kHz.

This is the same as that in which the electric and mechanical load was applied to the element when printing 7% to an A4 standard original (A4 image) at a printing speed of 15 sheets/min in A4 paper equivalent. The point where the value of a change in a liquid drop speed Vj becomes 5% was set to a deterioration point. 5% means that the amount of liquid drop is changed if Vj change exceeds 5%, affecting an image. If the change is less than 5%, it is determined there is no problem for use of an element. It is preferable to have a long time to change 5%.

TABLE 4

| | Ti THICKNESS | TiO$_2$ THICKNESS | PZT ORIENTATION RATIO (100) | (111) | (110) | REPETITIVE DRIVING Vj DURABILITY RESULT |
|---|---|---|---|---|---|---|
| COMPARATIVE EXAMPLE 4 | 2.0 | 3.4 | 51 | 21 | 29 | $3 \times 10^6$ TIME |
| EXPERIMENTAL EXAMPLE 9 | 3.5 | 6.0 | 80 | 10 | 10 | $5 \times 10^9$ TIME |
| EXPERIMENTAL EXAMPLE 8 | 5.0 | 8.6 | 93 | 5 | 2 | $7 \times 10^9$ TIME |
| EXPERIMENTAL EXAMPLE 10 | 6.5 | 11.1 | 92 | 6 | 2 | $7 \times 10^9$ TIME |
| COMPARATIVE EXAMPLE 5 | 8.0 | 13.6 | 79 | 8 | 13 | $9 \times 10^7$ TIME |
| COMPARATIVE EXAMPLE 6 | 9.5 | 16.2 | 52 | 31 | 17 | $5 \times 10^7$ TIME |

The repetition durability (Vj durability result in Table 4) is values when continuously counting the number of pulses when the liquid drop speed Vj changes 5%. $5 \times 10^9$ times corresponds to 160 H running (printing of 145000 A4 sheets) in the actual driving. In Experimental Examples 8 to 10 (Experimental Examples 9, 10), comparing with the after-described Comparative Examples 8 to 10, the repetition durability was larger at one digit or more, and sufficient durability was obtained. This shows that a film having preferable durability and less leakage can be obtained if the piezoelectric element having PZT (100) orientation is manufactured on the Pt film without having holes.

Experimental Examples 9, 10

When forming PZT (100), a Ti very thin film was formed as the orientation control layer of PZT, so as to obtain an oxidized titanium film by RTA oxidization. The reproducibility and the effect were confirmed.

The element as formed similar to Experimental Example 8 provided that the thickness of Ti was changed (3.5 nm in Experimental Example 9, and 6.5 nm in Experimental Example 10). The thickness of the titanium oxide after thermally oxidizing Ti as described in Table 4. Although the thickness has a preferable value, it is known that PZT (100) is formed as the main orientation as long as the thickness is within a certain range.

Similar to Experimental Example 8, after measuring the leakage amount in the polarization, it was about $10^{-7}$ $A/cm^{-2}$. Next, the driving durability test was performed. As a result, it was $5 \times 10^9$ times with 5% decrease as a standard, and a sufficient value for practical use was obtained.

Experimental Example 11

Similar to Experimental Example 2, an image-forming apparatus was manufactured by using the inkjet recording head with a piezoelectric element of the structure having the same structure as that in Experimental Examples 8 to 10. As a result, a result similar to Experimental Example 4 was obtained.

Comparative Example 1

The element was formed into 140 nm in thickness at a film-forming temperature of 575° C. as the conditions for forming Pt similar to Experimental Example 1. The particle diameter as seen from the surface after forming Pt was evaluated similar to Experimental Example 1, and the average particle diameter was 210 nm. The image by the scanning electron microscope is illustrated in FIG. 5 (refer to (c), (d)).

Figure 6:
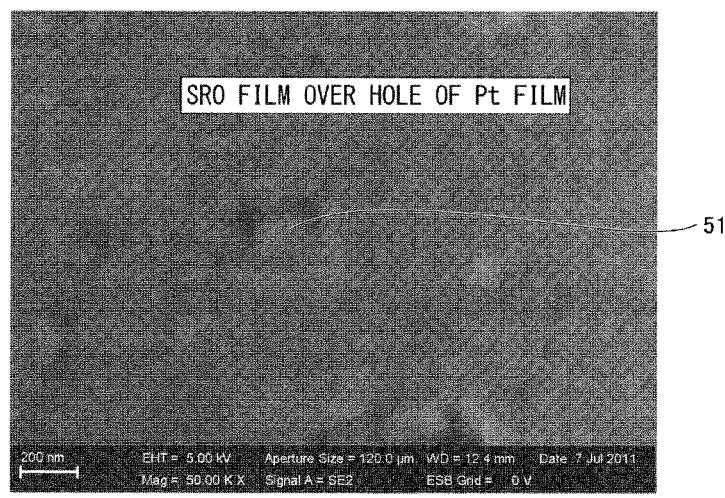
FIG. 6 is a view illustrating an SRO layer (conductive oxide layer) of a lower electrode photographed by SEM.

As illustrated by the dotted line circles in (c), (d) in FIG. 5, the holes are seen on the Pt grain boundary as seen from the surface. After forming SRO, a concave portion 51 as illustrated in FIG. 6 was observed.

After performing a polarization treatment, about ⅓ of bits which could not be polarized were generated. This is because the element was leakage-destroyed at the time of applying a voltage for polarization.

After measuring the leakage current relative to the polarized material, the leakage current of the element at the time of applying 30 V was 1.6 to $2.2 \times 10^{-5}$ $A/cm^{-2}$ under the condition which is the same as Experimental Example 1.

Comparative Example 2

A cross-sectional surface corresponding to Experimental Example 2 was formed in the sample of Comparative Example 1, and a composition observation was performed. As a result, Pb diffusion of PZT to the lower electrode direction was confirmed after the mapping measurement. The result is illustrated in FIG. 7.

Figure 7:
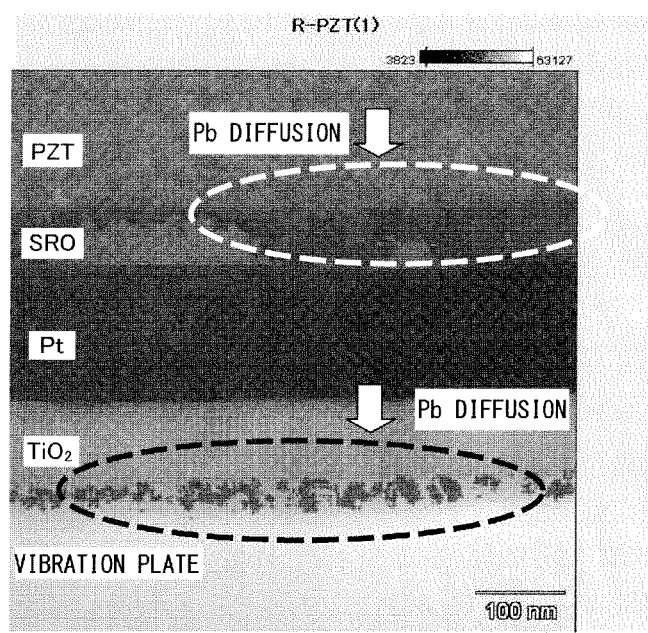
FIG. 7 is a view illustrating Pb diffusion near a hole in FIG. 6.

In FIG. 7, Pb diffusion is observed in the lower layer portion of $TiO_2$ layer in the portion without having large Pb diffusion in the SRO portion. It is considered from the observation result of the cross-sectional surface after forming the element that there is a portion without having holes in the previous stage because there is a portion having holes, so that the Pb diffusion is seen in the result of the cross-sectional face composition observation.

Comparative Example 3

Similar to Experimental Example 1, the Pt thickness was set to 130 nm, and the existence and non-existence of holes were confirmed. The result is shown in the above Table 2.

The holes similar to those in Comparative Example 1 were confirmed. After performing the polarization treatment, about ⅓ of the bits were not polarized. This is because the element was leakage-destroyed at the time of applying the voltage for polarization.

The leakage current was measured relative to the polarized material. With the same conditions as Experimental Example 1, the leakage current of the element when applying 30 V was about $10^{-5}$ $A/cm^{-2}$ similar to Comparative Example 1.

Comparative Example 4

This comparative example illustrates a case in which PZT (100) orientation is less than 80% orientation ratio. In this Comparative Example 4, the thickness of Ti which was formed by laminating on Pt was changed to 8.0 nm. Besides that, the piezoelectric thin film element was formed similar to Experimental Example 1, and the property of the piezoelectric thin film element was evaluated. The evaluation result is illustrated in Table 4.

Comparative Example 5

Similar to Comparative Example 4, Comparative Example 5 illustrates a case in which PZT (100) orientation is less than 80% orientation ratio.

In this Comparative Example 5, the piezoelectric thin film element was formed similar to Experimental Example 1 provided that the thickness of Ti which was formed by laminating on Pt was changed to 9.5 nm. The property of the piezoelectric thin film element was evaluated. The evaluation result is illustrated in Table 4.

Comparative Example 6

In this Comparative Example 6, the piezoelectric thin film element was formed similar to Experimental Example 1 provided that the thickness Ti which was formed by laminating on Pt was changed to 2.0 nm. The property of the piezoelectric thin film element was evaluated. The evaluation result is shown in Table 4.

Comparative Example 7

After forming Ti having 5 nm on the Pt film (130 nm, 575° C.) having holes, which is outside the range in Experimental Example 1, similar to Experimental Example 8, the $TiO_2$ film was formed by thermal oxidization under the condition of RTA. Then, PZT was formed. The crystallizability of PZT was that the PZT (100) orientation rate was about 50%. The same value as Experimental Example 8 was not obtained. The leakage amount was measured after obtaining an element, so that the leakage amount was about $10^{-5}$ $A/cm^{-2}$, which was a value two digits larger than that of a normal sample.

In order to obtain Pt crystallizability, the crystallizability of $TiO_2$ (size of crystal grain) is required. When Pt crystallizability is obtained, Pb diffuses if the crystal grain is simply large. However, according to the embodiment, if a thickness and a size according to the embodiment are used, Pt can grow as crystal without generating the Pb diffusion.

According to the Pt crystallizability of the present embodiment, not only PZT (11) but also PZT (100) can be laminated as the piezoelectric film (PZT) which is laminated on Pt. A $TiO_2$ very thin film is required as a base of the PZT film when growing PZT (100). When Pt with no holes is used, a very thin film which is laminated on Pt can be laminated without generating defects, so that PZT (100) having good orientation can be formed. As a result, a PZT film having a preferable displacement property and less displacement in repetition driving can be obtained. In this case, the orientation ratio of PZT (100) can be maintained to 90% or more.

Figure 8:
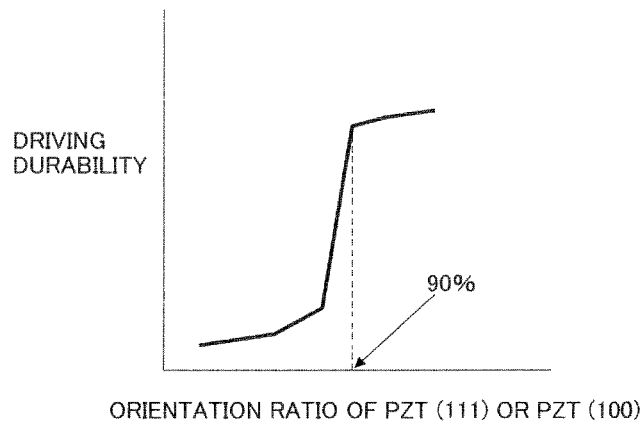
FIG. 8 is a graph illustrating a measurement result of a composition in a depth direction when PZT is laminated on a $TiO_2$ thin film with GE-OES (Glow Discharge-Optical Emission Spectroscopy).

The present embodiment focuses on the fact that the deterioration can be effectively prevented if there is no PZT (100) crystal. In the present embodiment, as illustrated in FIG. 8, the orientation rate of PZT (111) or PZT (100) is maintained to 90% or more, so that the driving durability of the piezoelectric element is improved. FIG. 8 illustrates the depth direction composition measurement result when laminating PZT on the $TiO_2$ thin film with GE-OES (Glow Discharge-Optical Emission Spectroscopy).

According to the present embodiment, even if a metal electrode film is formed under a condition of a high temperature of 500 to 600° C., a metal electrode film without holes can be formed by setting the thickness of the platinum or iridium metal film to 150 nm or more and 250 nm or less. The average particle diameter is 250 nm or more, which is a large particle diameter, so that sufficient properties of the piezoelectric film 14 can be obtained.

In the present embodiment, the conductive oxide layer 19 includes ruthenium acid strontium SRO ($SrRuO_3$), so that oxygen is supplied to the piezoelectric body thin film in long time driving. Thus, the deterioration can be prevented.

In the present embodiment, the piezoelectric film 14 is the composition of MPB (Morphotropic Phase Boundary) of PZT ($Pb(Zr_xTi_{1-x})O3$, in this case, x=appropriate 0.52), so that sufficient properties of the piezoelectric film 14 can be effectively obtained.

By using the piezoelectric thin film element of the present embodiment, an effective inkjet recording head with less deterioration can be achieved.

Embodiment 2

Figure 9:
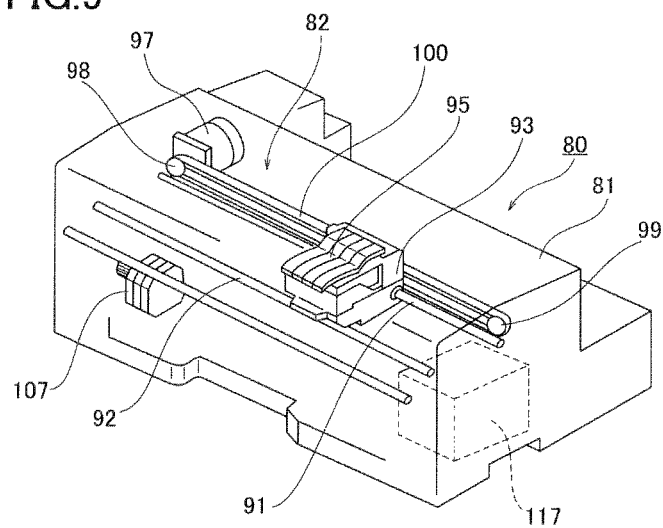
FIG. 9 is a perspective view illustrating an inkjet image-forming apparatus according to Embodiment 2.
Figure 10:
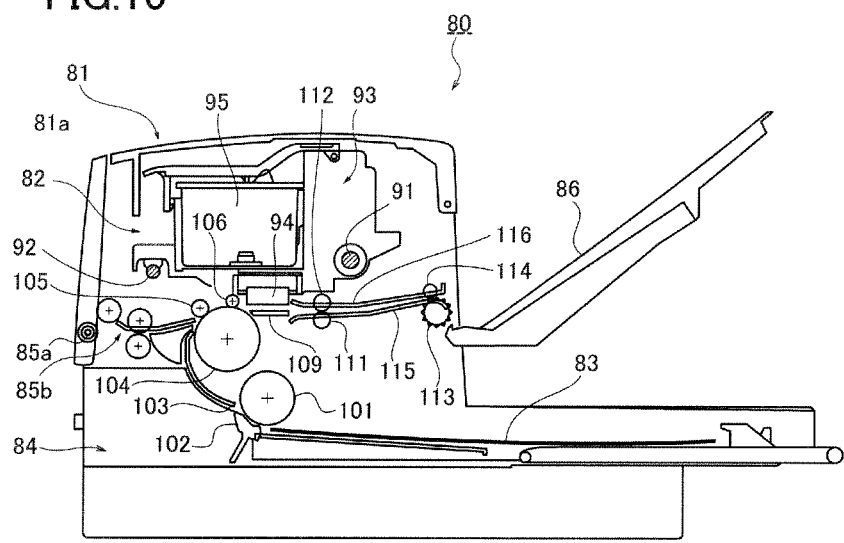
FIG. 10 is a sectional view illustrating a configuration of a mechanical portion of the inkjet image-forming apparatus in FIG. 9.

Next, one example of the inkjet image-forming apparatus including the inkjet recording head 40 illustrated in FIG. 3 will be described with reference to FIGS. 9, 10. FIG. 9 is a perspective view illustrating the inkjet image-forming apparatus. FIG. 10 is a sectional view illustrating the configuration of the mechanical portion of the inkjet image-forming apparatus.

The inkjet image-forming apparatus (hereinafter referred to as image-forming apparatus) 81 includes inside thereof a carriage 93 movable in the main-scanning direction and an ink cartridge 95 provided in the carriage 93. The carriage 93 and the ink cartridge 95 are provided in a printing mechanism 82.

A paper-feeding cassette 84 in which many sheets 83 can be placed is insertably provided in the lower portion of the image-forming apparatus 81. After loading the sheet 83 which is fed from the paper-feeding cassette 84, and recording a predetermined image by a printing mechanism the sheet is discharged to a paper discharge tray 86 attached to the back surface side of the apparatus.

The printing mechanism 82 slidably holds the carriage 93 in the main-scanning direction by a main guide rod 91 and a sub guide rod 92 supported in not-shown right and left side plates. This carriage 93 includes an inkjet recording head (hereinafter, recording head) 94 which discharges ink drops of yellow (Y), cyan (C), magenta (Z), and black (Bk). In addition, the inkjet recording head 94 is the same as the inkjet recording head 40 in Embodiment 1.

The recording head 94 is arranged such that a plurality of ink-discharging ports (nozzle hole) crosses the main-scanning direction, and the ink discharge direction faces downward. Each of the ink cartridges 95 for supplying each ink to the recording head 94 is exchangeably attached to the carriage 93.

The ink cartridge 95 includes in the upper side thereof an air port communicating with air and in the lower side thereof a supply port which supplies ink to the recording head 94. The ink cartridge 95 includes a porous body filled with ink. The ink to be supplied to the recording head 94 is maintained at a small negative pressure by the capillary force of the porous body.

The back side (downstream side in paper-feeding direction) of the carriage 93 is slidably supported by the main guide rod 91, and the front side (upstream side in the paper-feeding direction) of the carriage 93 is slidably supported by the sub-guide rod 92. A timing belt 100 is provided between a driving pulley 98 and a driven pulley 99 which rotate by a main-scanning motor 97, in order to move and scan the carriage 93 in the main-scanning direction. The timing belt 100 is fixed to the carriage 93, so that the carriage 93 reciprocates by the forward and reverse rotation of the main-scanning motor 97.

On the other hand, in order to feed the paper 83 set in the paper-feeding cassette 84 to the lower side of the recording head 94, a paper-feeding roller 101 and a friction pad 102 which separate and feed the sheet 83 from the paper-feeding cassette 84, and a guide member 103 which guides the sheet 83 are provided. Moreover, a feeding roller 104 which feeds the fed sheet 83 by reverse rotation, a transfer roller 105 which is pressed to the circumferential surface of the feeding roller 104, and a leading end roller 106 which defines a feeding angle of the sheet 83 from the feeding roller 104 are provided. The feeding roller 104 rotates and drives by a sub-scanning motor 107 through a gear train.

A print receiving member 109, which guides the sheet 83 fed from the feeding roller 104 corresponding to the moving range of the carriage 93 in the main-scanning direction on the lower side of the recording head 94, is provided. A paper-feeding roller 111 and a roller 112 which rotate for feeding the sheet 83 in the paper discharge direction are provided. A paper discharge roller 113 which feeds the sheet 83 to the paper discharge tray 86, a roller 114, and guide members 115, 116 which form a paper discharge path are provided.

In recording, by driving the recording head 94 according to image signals while moving the carriage 93, one line is recorded by discharging ink on the stopped sheet 83, and the next line is recorded after feeding the sheet 83 by a predetermined amount. The recording operation is completed and the sheet 83 is discharged in response to the reception of the recording complete signal or the signal indicating that the back end of the sheet 83 has reached the recording area.

A recovery device 117 which recovers the discharge error of the recording head 94 is disposed in a position outside the recording area of the right end side of the carriage 93 in the moving direction. The recovery device 117 includes a cap, a sucker, and a cleaner. The carriage 93 moves on the recovery device 117 side during a print standby state, and the recording head 94 is capped by the cap, so that discharge error due to dried ink can be prevented by maintaining the discharge port in a wet condition. The ink velocity of all discharge ports can be constant by discharging ink which has no relationship with recording during recording, so that a stable discharge performance can be maintained.

When a discharge error occurs, the discharge port of the recording head 94 is sealed by the cap, and bubbles are sucked together with the ink from the discharge port by the sucker through a tube. The ink or dust adhered on the discharge port surface are eliminated by the cleaner. The discharge error is thus recovered. In addition, the sucked ink is discharged in a not-shown discharged ink space provided in the lower portion of the device, and is sucked and held in the ink suction body in the discharged ink space.

As described above, the image-forming apparatus 81 includes the ink jet recording head 40 manufactured in Embodiment 1, so that a stable ink drop discharge property can be obtained without having an ink drop discharge error due to a vibration plate driving error. Thus, an image quality is improved.

According to the embodiment, an effective inkjet age-forming apparatus can be obtained.

According to Embodiments of the present invention, the platinum metal film or the iridium metal film is a precise film having a thickness of 150 nm or more and 250 nm or less, and an average particle diameter of crystal of 250 nm or more without having a hole. Therefore, the component diffusion to the base layer which causes deterioration in a property of a dielectric film can be controlled, so that a property of a piezoelectric film can be improved.

Although the embodiments of the present invention have been described above, the present invention is not limited thereto. It should be appreciated that variations may be made in the embodiments described by persons skilled in the art without departing from the scope of the present invention.

What is claimed is:

1. A piezoelectric thin film element, comprising:
a substrate;
a vibration plate provided on the substrate;
a lower electrode provided on the vibration plate, the lower electrode including at least a platinum metal film or an iridium metal film;
a piezoelectric film provided on the lower electrode, the piezoelectric film including a polycrystalline body; and
an upper electrode provided on the piezoelectric film,
the lower electrode being provided on an upper portion of a titanium oxide film formed on the vibration plate,
the lower electrode including a platinum metal film or an iridium metal film formed on the titanium oxide film, and
the platinum metal film or the iridium metal film being a precise film without having a hole that is in a crystal grain boundary of the platinum metal film or a crystal grain boundary of the iridium metal film and that permits Pb diffusion of Pb in the piezoelectric film into the platinum metal film or the iridium metal film, the precise film having a thickness of 150 nm or more and 250 nm or less and having an average particle diameter of crystal of 250 nm or more.

2. The piezoelectric thin film element according to claim 1, wherein the piezoelectric film is a composition of MPB (Morphotropic Phase Boundary) of PZT (Pb ($Zr_xTi_{1-x}$) $O_3$, x=approximate 0.52).

3. An inkjet recording head comprising the piezoelectric thin film element according to claim 1.

4. An inkjet image-forming apparatus comprising the inkjet recording head according to claim 3.

5. A piezoelectric thin film element, comprising:
a vibration plate on a substrate;
a lower electrode provided on the vibration plate, the lower electrode including at least a platinum metal film or an iridium metal film;
a piezoelectric film provided on the lower electrode, the piezoelectric film including a polycrystalline body; and
an upper electrode provided on the piezoelectric film,
the lower electrode being formed on an upper portion of a titanium oxide film formed on the vibration plate,
the platinum metal film or the iridium metal film being a precise film without having a hole that is in a crystal grain boundary of the platinum metal film or a crystal grain boundary of the iridium metal film and that pen Pb diffusion of Pb in the piezoelectric film into the platinum metal film or the iridium metal film, the precise film having a thickness of 150 nm or more and having an average particle diameter of 250 nm or more, and
the piezoelectric film being formed on the lower electrode having (100) priority orientation.

6. The piezoelectric thin film element according to claim 5, wherein the (100) orientation component of the piezoelectric film is an orientation ratio of 90% or more if an orientation ratio ρ when the sum of a peak of each orientation of (111), (100), (110) obtained with XRD is 1 is obtained by the following formula (1), where the denominator represents the sum of each peak intensity of (111), (100), (110), and the numerator represents a peak intensity of arbitrary orientation $$\rho = I(hkl)/\Sigma I(hkl) \tag{1}.$$

7. The piezoelectric thin film element according to claim 5, wherein the titanium oxide film has a high Ti ratio on a side close to the lower electrode.

8. A piezoelectric thin film element, comprising:
a vibration plate on a substrate;
a lower electrode provided on the vibration plate, the lower electrode including at least a platinum metal film or an iridium metal film;
a piezoelectric film provided on the lower electrode, the piezoelectric film including a polycrystalline body; and
an upper electrode provided on the piezoelectric film,
the lower electrode being formed on an upper portion of a titanium oxide film formed on the vibration plate,
the platinum metal film or the iridium metal film being a precise film without having a hole that is in a crystal grain boundary and that permits Pb diffusion, the precise film having a thickness of 150 nm or more and having an average particle diameter of 250 nm or more, and
the piezoelectric film being formed on the lower electrode having (100) priority orientation,
wherein the piezoelectric film is a composition of MPB (Morphotropic Phase Boundary) of PZT (Pb ($Zr_xTi_{1-x}$) $O_3$, x=approximate 0.52).

9. An inkjet recording head comprising the piezoelectric thin film element according to claim 5.

10. An inkjet image-forming apparatus comprising the inkjet recording head according to claim 9.

11. The piezoelectric thin film element according to claim 1, wherein the upper electrode includes a conductive oxide and platinum.

12. The piezoelectric thin film element according to claim 5, wherein the upper electrode includes a conductive oxide and platinum.

13. The piezoelectric thin film element according to claim 8, wherein the upper electrode includes a conductive oxide and platinum.

* * * * *